(12) United States Patent
Staszewski et al.

(10) Patent No.: US 6,809,598 B1
(45) Date of Patent: Oct. 26, 2004

(54) HYBRID OF PREDICTIVE AND CLOSED-LOOP PHASE-DOMAIN DIGITAL PLL ARCHITECTURE

(75) Inventors: Robert B. Staszewski, Garland, TX (US); Dirk Leipold, Plano, TX (US); Kenneth Maggio, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 163 days.

(21) Appl. No.: 09/695,516

(22) Filed: Oct. 24, 2000

(51) Int. Cl.[7] ............................................. H03L 7/06

(52) U.S. Cl. ........................ 331/16; 331/17; 331/1 A; 331/25; 327/156; 327/157; 327/159; 375/376

(58) Field of Search ...................... 331/16, 17, 1 A, 331/25; 327/156, 157, 159; 375/376

(56) References Cited

U.S. PATENT DOCUMENTS

| | | | | |
|---|---|---|---|---|
| 4,862,098 A | * | 8/1989 | Yassa et al. ................. | 329/358 |
| 6,326,851 B1 | * | 12/2001 | Staszewski et al. ........... | 331/17 |
| 6,345,173 B1 | * | 2/2002 | Fourtet et al. ................ | 455/76 |

* cited by examiner

*Primary Examiner*—Arnold Kinkead
(74) *Attorney, Agent, or Firm*—Ronald O. Neerings; Wade James Brady, III; Frederick J. Telecky, Jr.

(57) ABSTRACT

A phase-domain digital PLL loop is implemented using a hybrid of predictive and closed-loop architecture that allows direct DCO oscillator transmit modulation in the GFSK modulation scheme of "BLUETOOTH" or GSM, as well as the chip phase modulation of the 802.11*b* or Wideband-CDMA. The current gain of the DCO oscillator is predicted by observing past phase error responses to previous DCO corrections. DCO control is then augmented with the "open-loop" instantaneous frequency jump estimate of the new frequency control word.

25 Claims, 5 Drawing Sheets

HYBRID OF PREDICTIVE AND CLOSED-LOOP PHASE-DOMAIN DIGITAL PLL ARCHITECTURE

RELATED PATENT APPLICATIONS

This application claims the benefit, under 35 U.S.C. §119(e)(1), of U.S. Provisional Application No. 60/186,251, entitled Hybrid of predictive/closed-loop digital PLL operation, filed Mar. 1, 2000 by Robert B. Staszewski and Dirk Leipold; and U.S. Provisional Application No. 60/198,907, entitled PLL loop compensation scheme for the frequency/phase modulation, filed Apr. 20, 2000 by Robert B. Staszewski, Ken Maggio and Dirk Leipold.

This application is related to U.S. patent application Ser. No. 09/603,023, entitled Digital Phase-Domain PLL Frequency Synthesizer, filed Jun. 26, 2000, by Robert B. Staszewski and Dirk Leipold; and U.S. patent application Ser. No. 09/608,317, entitled Digital Fractional Phase Detector, filed Jun. 30, 2000, by Robert B. Staszewski and Dirk Leipold, both applications assigned to the assignee of the present invention and incorporated by reference in their entirety herein.

BACKGROUND OF THE INVENTION

1. Field of the Invention

This invention relates generally to phase lock loops, and more particularly to an all-digital phase-domain phase-lock loop (PLL) that employs a hybrid of predictive and closed-loop architectures.

2. Description of the Prior Art

Open-loop modulation techniques for data transmission are well-known in the prior art, and exhibit undesirable frequency wander and drift Feed forward, closed-loop modulation techniques with phased-lock loop compensation for data transmission are also well known in the prior art. These closed-loop solutions use an analog compensation that is only approximate because of component matching difficulties and disagreement between the transfer functions.

The idea of phase compensating a phase locked loop (PLL) by digitally integrating the transmit modulating data bits and using the integrator output to shift the phase of the reference clock signal, while the Gaussian filtered data directly frequency modulates the VCO has been disclosed by M. Bopp et al., "A DECT transceiver chip set using SiGe technology," *Proc. of IEEE Solid-State Circuits Conf.*, sec. MP4.2, pp. 68–69, 447, February 1999. This approach however, is rather analog in nature and therefore requires precise component matching, of not only the VCO, but also the phase shifter.

A similar feed-forward compensation method which also requires a precise knowledge of the ever-changing model of the VCO and other analog circuits has been disclosed by B. Zhang, P. Allen, "Feed-forward compensated high switching speed digital phase-locked loop fluency synthesizer," *Proc. Of IEEE Symposium on Circuits and Systems*, vol. 4, pp. 371–374, 1999.

In view of the foregoing, it is highly desirable to have a digitally-intensive PLL architecture that is compatible with modern CMOS technology in order to reduce parameter variability generally associated with analog circuits.

SUMMARY OF THE INVENTION

The present invention is directed to a hybrid of a predictive and closed-loop PLL technique and its most preferred application to implement a direct oscillator transmit modulation. An all-digital type-I PLL loop includes a digitally-controlled oscillator (DCO) where the DCO control and resulting phase error measurements are in numerical format. The current gain of the DCO is easily predicted by simply observing the past phase error responses to the DCO. With a good estimate of the current oscillator gain, normal DCO control can then be augmented with the "open loop" instantaneous frequency jump estimate of the new frequency control word command. The resulting phase error is expected to be very small and subject to the normal closed PLL loop correction transients.

According to one embodiment, a digital phase-locked loop with a modulation circuit comprises:

a digital phase-locked loop having a phase detector, a loop filter and a digitally-controlled oscillator (DCO), wherein the DCO is responsive to an oscillator tuning word (OTW) to generate a DCO output clock, and further wherein the phase detector is responsive to a channel selection signal, a modulating data signal and the output clock generated by the DCO to generate a phase detector output signal, and further wherein the loop filter generates a filtered phase error in response to the output signal generated by the phase detector; and a direct modulator operational in response to the filtered phase error and the modulating signal to generate the OTW.

According to another embodiment, a phase-locked loop with a modulation circuit comprises:

a digitally-controlled oscillator responsive to an oscillator tuning word (OTW) to generate an oscillator output clock;

a direct modulator operational in response to a modulating signal and a filtered phase error to generate the OTW; and an accumulator circuit operational in response to a frequency division ratio command, the modulating data signal and clock edge counts associated with the oscillator output clock to generate the phase error.

According to still another embodiment of the present invention, a digital phase-domain phase-locked loop circuit comprises:

a digitally-controlled oscillator (DCO);

a gain element feeding the DCO and operational to compensate DCO gain in response to a loop gain signal such that the DCO gain will have substantially no effect on loop behavior;

an oscillator phase accumulator operational to accumulate DCO generated clock edges;

a reference phase accumulator operational to accumulate a frequency division ratio command and a modulating data signal and to generate an accumulated frequency control word (FCW) therefrom;

a phase detector operational to compare the accumulated FCW and the accumulated DCO generated clock edges and generate a phase error in response thereto; and a direct modulator operational in response to the modulating data signal and the phase error to generate the loop gain signal.

According to still another embodiment of the present invention, a method of operating a phase-locked loop having a digitally-controlled oscillator comprises the steps of:

(a) providing a phase-locked loop including a digitally-controlled oscillator (DCO) having a gain $K_{DCO}$, a phase detector, and a loop filter, wherein the DCO is responsive to an oscillator tuning word (OTW) to generate a DCO output clock having a frequency fv, and further wherein the phase detector is responsive to a channel selection signal, a modulating data signal and the output clock to generate a phase detector output signal and further wherein the loop filter generates a filtered phase error in response to the phase detector output signal;

(b) providing a direct modulator operational in response to the filtered phase error and the modulating data signal to generate the OTW;

(c) communicating a channel selection signal to the phase detector and simultaneously communicating a calibration modulating data signal to both the phase detector and the direct modulator, and observing a change $\Delta\phi$ in the phase detector output signal in response to a given change $\Delta x$ in the OTW; and (d) estimating a DCO gain $\hat{K}_{DCO}$, defined by $$\hat{K}_{DCO} = \frac{\Delta\phi}{\Delta x} \cdot f_{ref}$$

such that the DCO gain $K_{DCO}$ can be compensated to substantially remove its effects on loop behavior.

In one aspect of the invention, a hybrid of predictive and closed PLL loop techniques is used to estimate and compensate for the gain of a DCO.

In another aspect of the invention a hybrid of predictive and closed PLL loop techniques is used to minimize undesirable parameter variability normally associated with analog circuits.

In yet another aspect of the invention, a hybrid of predictive and closed PLL loop techniques is used to directly implement oscillator frequency/phase transmit modulation to minimize system transmitter requirements.

In still another aspect of the invention, a hybrid of predictive and closed PLL loop techniques is used to implement an all-digital phase-domain PLL frequency synthesizer that accommodates the "BLUETOOTH" standard.

In still another aspect of the invention, a hybrid of predictive and closed PLL loop techniques employs fractional phase error correction such that a digitally-controlled oscillator gain can be compensated to substantially remove its effects on PLL loop behavior.

BRIEF DESCRIPTION OF THE DRAWINGS

Other aspects and features of the present invention and many of the attendant advantages of the present invention will be ready appreciated as the same become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
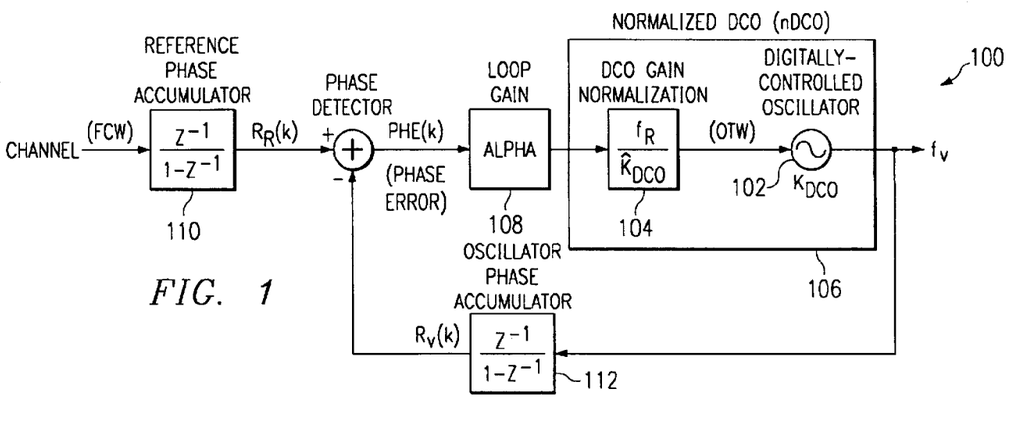
FIG. 1 is a simplified block diagram illustrating a phase-domain all-digital synchronous PLL loop synthesizer.

FIG. 1 is a simplified block diagram illustrating a phase-domain all/digital synchronous PLL loop synthesizer 100. Synthesizer 100 is described more fully in U.S. patent application Ser. No. 09/603,023 referenced above and is incorporated by reference herein in its entirety. At the heart of the synthesizer 100 lies a digitally-controlled oscillator (DCO) 102 with a physically-inherent gain of $K_{DCO}$, defined as an oscillating frequency deviation from the carrier (in Hz) in response to 1 LSB of the input change. DCO 102 is described more fully in U.S. Patent Application Ser. No. 09/679,793 entitled Digitally-Controlled L-C Oscillator, filed on Oct. 5, 2000 by Robert B. Staszewski and Dirk Leipold which is incorporated by reference herein in its entirety. The DCO 102 oscillator, together with the DCO gain normalization $f_{ref}/\hat{K}_{DCO}$ multiplier 104, logically comprise the normalized DCO (nDCO) 106. The DCO 102 gain normalization decouples the phase and frequency information throughout the system 100 from the process, voltage and temperature variations. The phase information is normalized to $2\pi$ radians of the oscillator 102, whereas the frequency information is normalized to an external reference frequency $f_{ref}$. As described herein below, the $\hat{K}_{DCO}$ estimate is another input and is calculated entirely in the digital domain by observing the past phase error responses to the previous DCO 102 or nDCO 106 phase error corrections.

A normalized loop gain a multiplier 108 can be seen feeding the nDCO 106. The normalized proportional loop gain constant $\alpha$ is a programmable PLL loop parameter that controls the loop bandwidth. It is defined as how much phase attenuation is expected to be observed at the phase detector output in response to a certain change in the phase detector output at the previous reference clock cycle.

Figure 2:
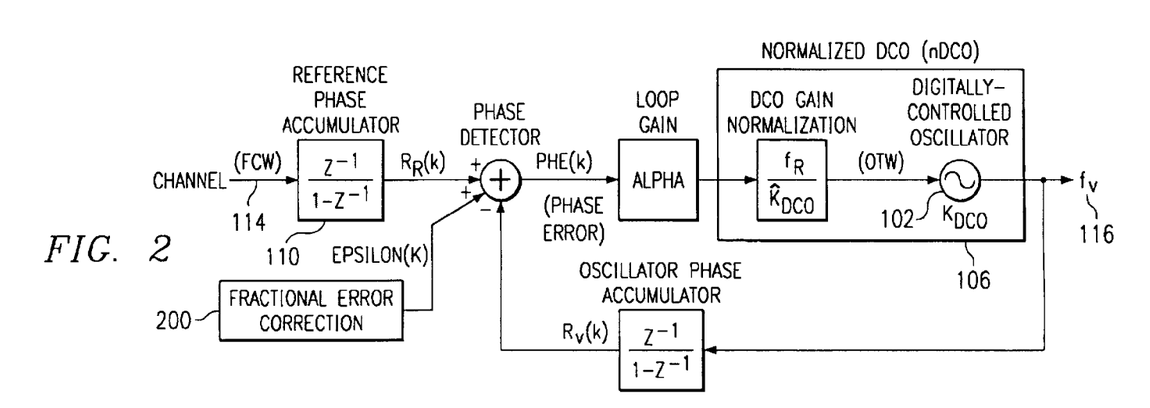
FIG. 2 is a simplified block diagram that exemplifies fractional phase error correction implemented with the phase-domain all-digital synchronous PLL loop synthesizer depicted in FIG. 1.

The PLL loop is a synchronous all-digital phase-domain architecture that arithmetically compares the accumulated frequency control word (FCW) in the reference phase accumulator $R_R(k)$ 110 with the DCO 102 clock edge count in the variable phase accumulator $R_v(k)$ 112 in order to arrive at the phase error correction. Not shown is the coarse integer phase error being compensated by the finer fractional error correction in order to increase the phase resolution of the system 100, such as described in U.S. patent application Ser. No. 09/608,317 referenced herein above. The FCW input 114 to the reference phase accumulator 110 is used to establish the operating frequency of the desired channel and it is expressed in a fixed-point format such that 1 LSB of its integer part corresponds to the $f_{ref}$ reference frequency. FIG. 2 is a simplified block diagram that exemplifies factional phase error correction 200 implemented with the phase-domain all-digital synchronous PLL loop synthesizer 100 depicted in FIG. 1.

With continued reference now to FIG. 1, the oscillating frequency $f_v$ 116 could be dynamically controlled by directly adding the modulating data y(k) to the channel command of the reference phase accumulator input FCW 114. Generally, direct frequency or phase transmit modulation of a PLL loop of a RF frequency synthesizer is rather a challenging task. In order to attenuate the reference spurs, the PLL bandwidth is usually kept low. This effectively prevents an application of closed loop modulation if the modulating data rate is not much smaller than the loop bandwidth. The direct closed-loop modulation of the DCO frequency 116 is considered however, to be a more cost effective solution than alternative of an image reject quadrature modulator.

Taking advantage of the predictive capabilities of the all-digital PLL loop as now described below could dramatically enhance the PLL loop operation. The nDCO 106 does not necessarily have to follow the modulating FCW command discussed herein above with the normal PLL loop response. In the phase-domain all-digital synchronous PLL loop synthesizer 100 shown in FIGS. 1 and 2, for example, where the nDCO 106 control and the resulting phase error measurement are in numerical format, it is easy to predict the current $\hat{K}_{DCO}$ gain of the oscillator 106 by simply observing the past phase error responses to the previous DCO 102 or nDCO 106 corrections. With a good estimate of the $\hat{K}_{DCO}$ gain, the normal DCO control could be augmented with the "open loop" instantaneous frequency jump estimate of the new FCW command. The resulting phase error should be small and subject to the normal closed PLL loop correction transients.

Since the time response of this type-I PLL loop is very fast (less than a few µs), the prediction feature is less important for channel hopping, where the allowed time is much greater. It is, however, essential to realize the direct frequency synthesizer modulation in the Gaussian frequency shift keying (GFSK) modulation scheme of "BLUE-TOOTH" or GSM, as well as the chip phase modulation of the 802.1 lb or Wideband CDMA.

Figure 3:
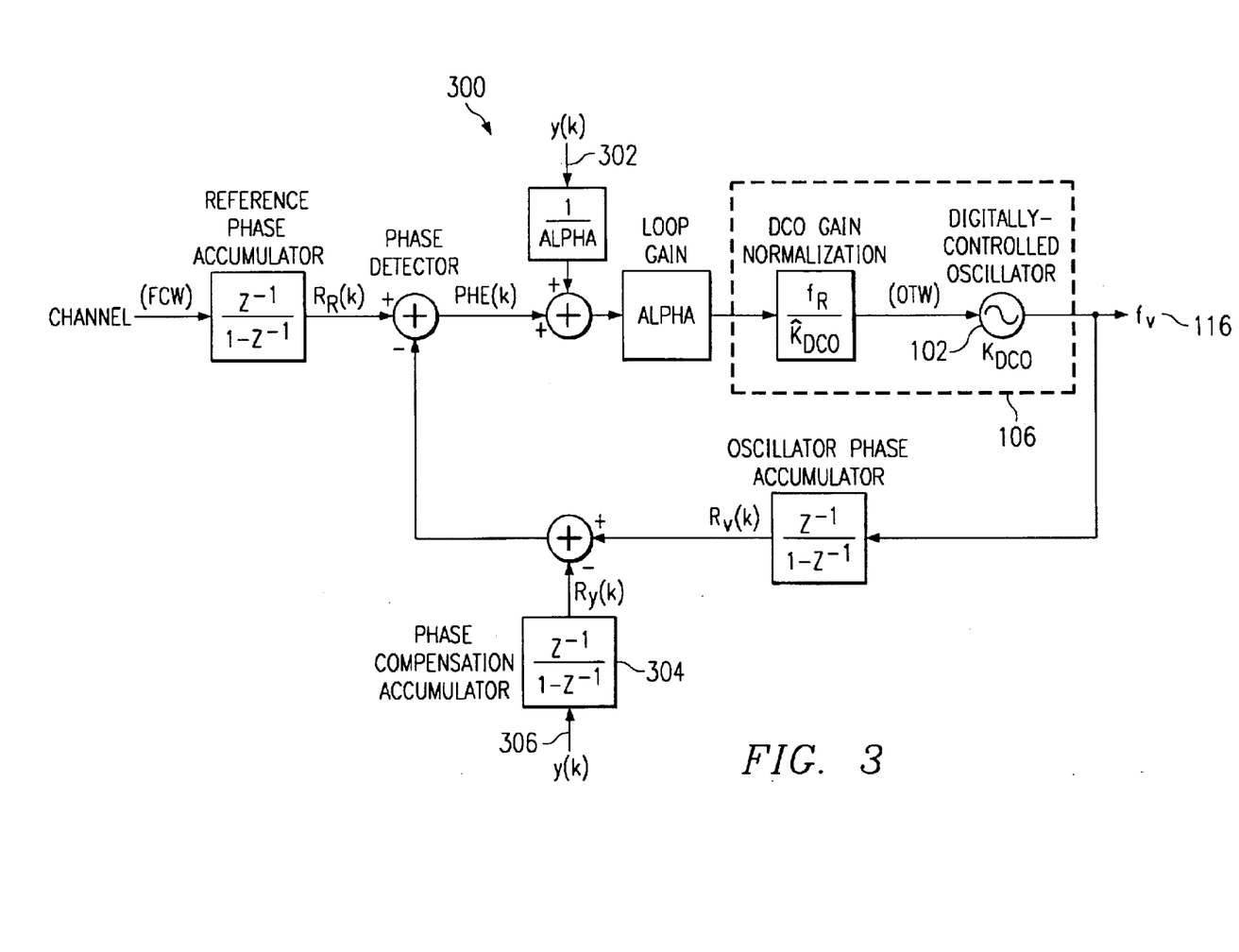
FIG. 3 is a block diagram illustrating direct oscillator modulation with a straightforward PLL loop compensation scheme according to one embodiment of the preset invention.

FIG. 3 is a block diagram illustrating a technique 300 for implementing direct oscillator modulation with a straight-forward PLL loop compensation scheme according to one embodiment of the present invention. The DCO frequency 116 is directly modulated in a feed-forward manner such that it effectively removes the loop dynamics from the modulating transmit path. The rest of the loop however, including all error sources, operates under the normal closed-loop regime. The modulating data y(k) at the upper feed 302 directly affects the oscillating frequency with the transfer function:

$$h^f_{dir}(k) = \frac{1}{\alpha} \cdot \alpha \cdot \frac{f_R}{\hat{K}_{DCO}} \cdot K_{DCO} = f_R \cdot \frac{K_{DCO}}{\hat{K}_{DCO}} \quad (1)$$

Unfortunately, the PLL loop will try to correct this perceived frequency perturbation integrated over the update period $1/f_R$ and the phase transfer function is:

$$h_{dir}(k) = \frac{1}{f_R} \cdot f_R \cdot \frac{K_{DCO}}{\hat{K}_{DCO}} = \frac{K_{DCO}}{\hat{K}_{DCO}} \quad (2)$$

If the nDCO 106 gain estimate $\hat{K}_{DCO}$ is accurate, the $h_{dir}$=1.

The transfer characteristic of the PLL loop with only the upper feed 302 is high-pass. The low frequency components of the y(k) data will be integrated in the variable accumulator, thus affecting the oscillator frequency baseline. It is necessary, therefore, to add a phase compensating circuit $R_y(k)$ 304, as shown at the lower y(k) feed 306, that would completely subtract the phase contribution of the upper y(k) direct modulation feed 302 into the PLL loop if the DCO gain could be estimated correctly. The phase compensating transfer function is:

$$h_{comp}(k)=1 \quad (3)$$

Figure 4:
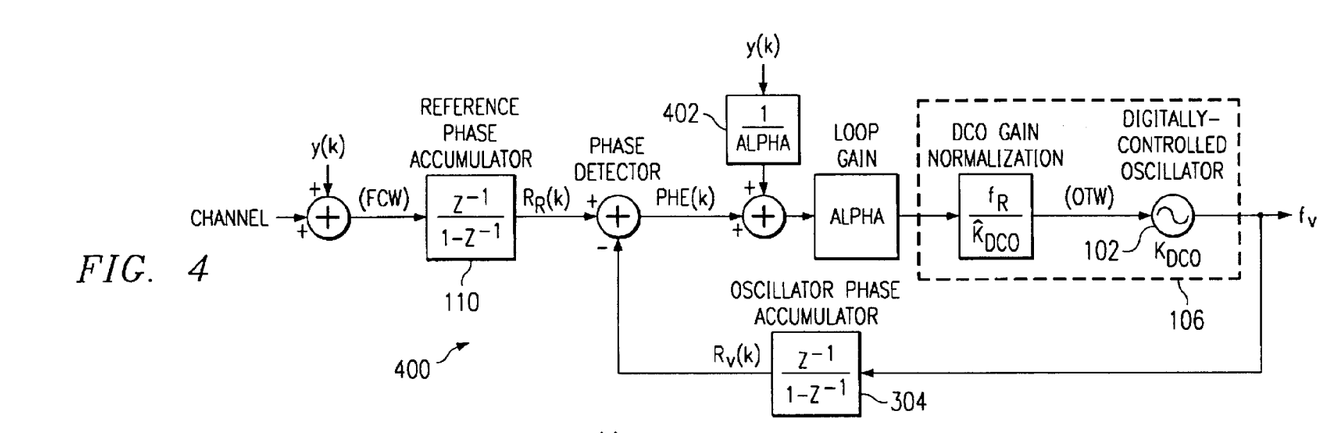
FIG. 4 is a block diagram illustrating direct oscillator modulation with a PLL loop compensation scheme according to another embodiment of the present invention.

FIG. 4 is a block diagram illustrating a technique for implementing direct oscillator modulation with a PLL loop compensation scheme 400 according to another embodiment of the present invention. The PLL loop compensation scheme 400 merges the phase compensation accumulator $R_y(k)$ 304 with the reference phase accumulator $R_R(k)$ 110. The frequency control word (FCW) now becomes the sum of the channel and modulating data y(k) signals which is more intuitive. This direct oscillator modulation with the PLL compensating scheme 400 works best in a digital implementation since almost perfect compensation can be achieved. It can be appreciated by those skilled in the art that the foregoing scheme 400 will function equally well with a higher order PLL loop.

Figure 5:
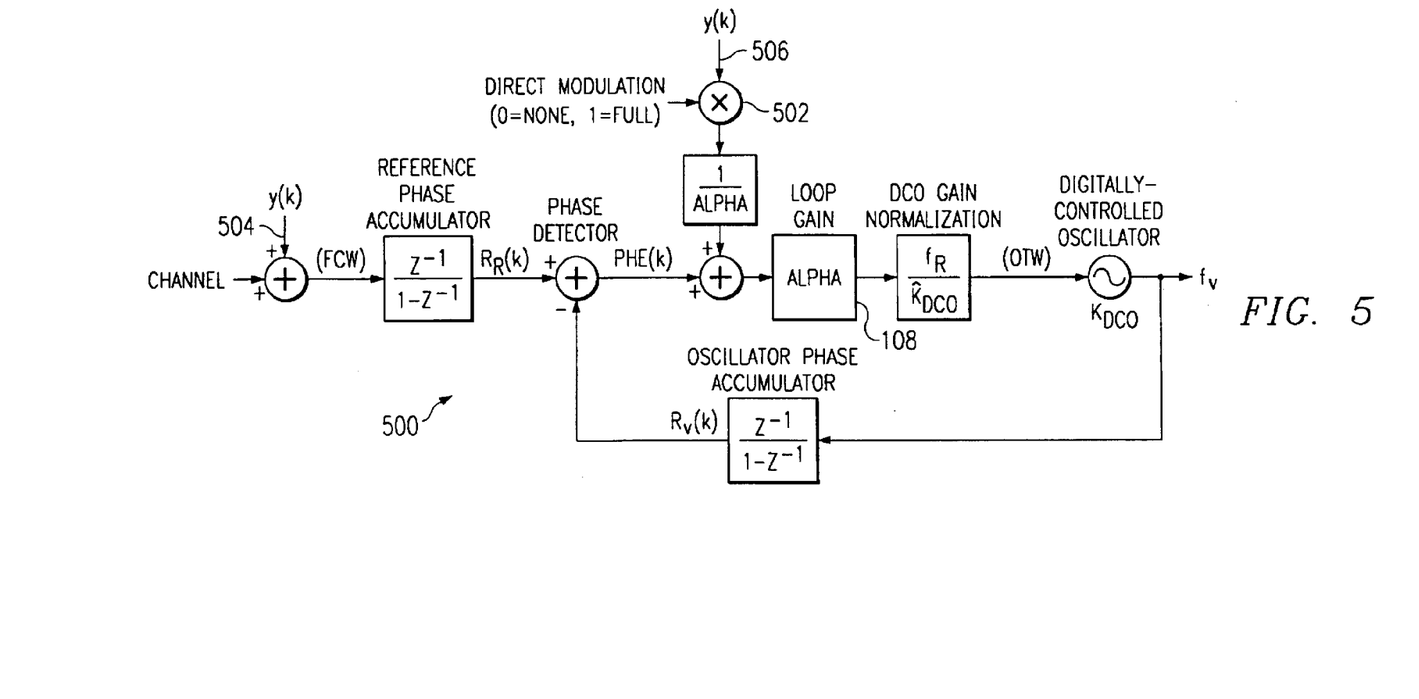
FIG. 5 is a block diagram illustrating partially-direct oscillator modulation with a PLL loop compensation scheme according to one embodiment of the present invention.

FIG. 5 is a block diagram illustrating a technique for implementing partially-direct oscillator modulation with a PLL loop compensation scheme 500 according to one embodiment of the present invention. When the direct modulation slider 502 gain is set to zero, the transmit modulating data y(k) undergoes the normal attenuation of the PLL loop low-pass filtering characteristics. When the direct modulation slider 502 gain is set to one however, the direct path, left y(k) 504, will fully undo the loop response due to the feedforward transmit data path, right y(k) 506. It can be appreciated the slider 502 gain value could also be set somewhere between the two extremes of 0 and 1 for partial direct modulation. Selective attenuation, as used herein, then means, either no attenuation, complete attenuation, or anything in between the two extremes of no attenuation and complete attenuation.

Figure 6:
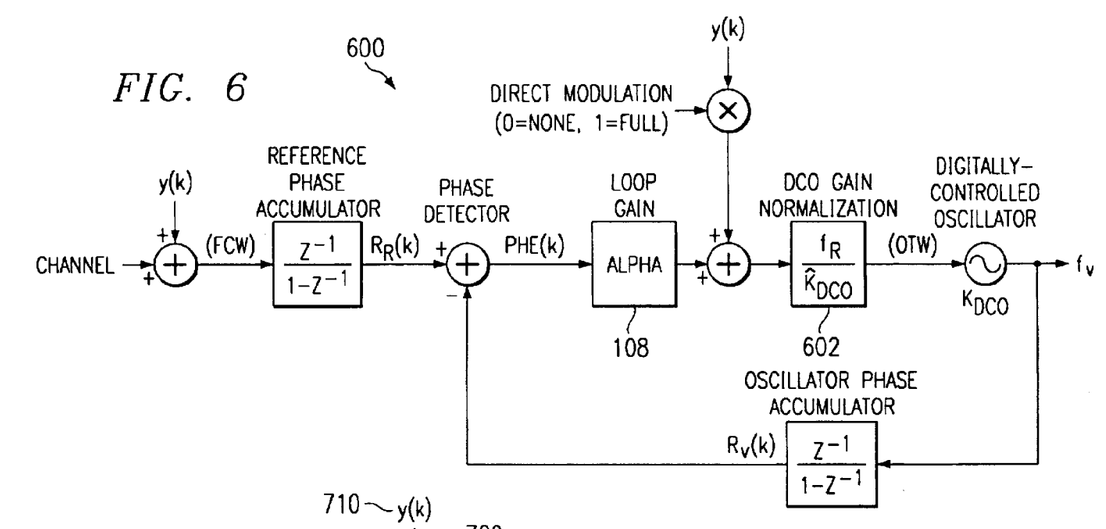
FIG. 6 is a block diagram illustrating partially-direct oscillator modulation with a PLL loop compensation scheme according to another embodiment of the present invention.

FIG. 6 is a block diagram illustrating a technique for implementing partially-direct oscillator modulation with a PLL loop compensation scheme 600 according to another embodiment of the present invention. If the loop parameter α is simply a power of two, which might seem quite adequate, then the architecture 500 depicted in FIG. 5 is a good choice since the alpha loop gain multiplier 108, if implemented as a bit shift operator, can be merged with the DCO gain normalization element 602. Those skilled in the art will appreciate implementation of a 1/α operator is equally trivial. If, however, α is a combination of a few power-of-two numbers, i.e., low resolution mantissa, then the structure 600 illustrated in FIG. 6 is preferred since the inverse operation 1/α is no longer necessary.

Figure 7:
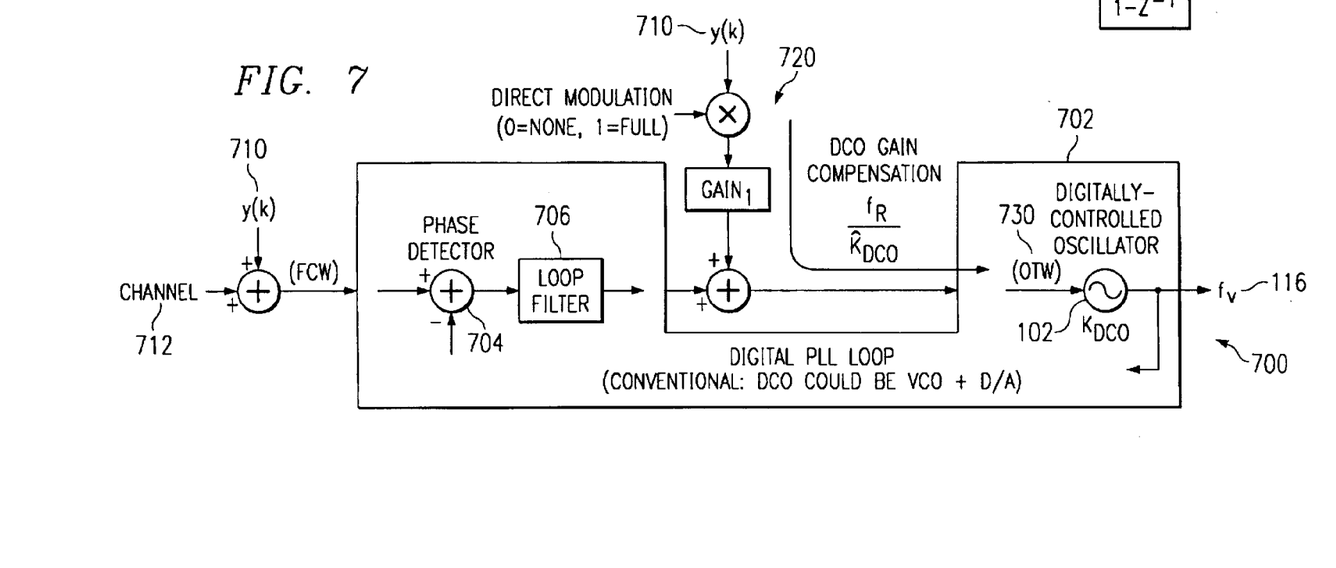
FIG. 7 is a block diagram illustrating direct oscillator modulation with a PLL loop compensation within a general digital PLL architecture according to one embodiment of the present invention.

FIG. 7 is a block diagram illustrating direct oscillator modulation with a PLL loop compensation within a general digital PLL architecture 700 according to one embodiment of the present invention. PLL 702 includes a DCO 102, phase detector 704 and loop filter 706. A conventional PLL that could be used to practice the present invention may include a VCO, a frequency prescaler and divider, phase detector, loop filter and a digital to analog converter (DAC) that makes it possible to control the oscillating frequency through a digital word. The modulating data y(k) 710 is dynamically added to the channel frequency information 712 in order to affect frequency or phase of the oscillator 102 output $f_v$ 116. This could be accomplished, for example, by controlling the frequency division ratio of the fractional-N PLL loop 702. The direct modulation structure 720 is inserted somewhere between the loop filter 706 and the oscillator 102 such as depicted in FIG. 7. Gain of the direct modulating path from y(k) 710 to the oscillator 102 input should be $$\frac{f_{ref}}{\hat{K}_{DCO}}$$

if y(k) is expressed as the unitless fractional division ratio.

The only unknown parameter of the system 700 is the DCO 102 gain $K_{DCO}$, as discussed herein before. An estimate of the DCO 102 gain $K_{DCO}$, could be performed entirely in the digital domain by observing the past phase error responses to the previous DCO 102 or nDCO 106 phase error corrections.

$$K_{DCO} = \frac{\Delta f}{\Delta x} \qquad (4)$$

where, $\Delta f$ is an oscillating frequency deviation in response to a $\Delta x$ change to the digital oscillator tuning word (OTW) input 730. $K_{DCO}$ should be fairly linear with respect to the input, otherwise, the DCO gain could be generalized as being a function $K_{DCO}(x)$ of the input x (which is OTW).

$$K_{DCO}(x) = \frac{\Delta f}{\Delta x} \qquad (5)$$

The frequency deviation $\Delta f$ can not be readily measured. It can however, be ascertained by observing the accumulated phase $\Delta \phi$ (expressed as a fraction of the DCO 102 clock period) in the observation interval of the phase detector 706 update, which is equal to the frequency reference clock period $T_{ref}$.

$$\Delta f = \frac{\Delta \phi}{T_{ref}} = \Delta \phi \cdot f_{ref} \qquad (6)$$

Equation 6 can then be combined with equation 5 to provide an estimated gain $$\hat{K}_{DCO}(x) = \frac{\Delta \phi}{\Delta x} \cdot f_{ref} \qquad (7)$$

where, equation 7 allows one to calculate the local value, i.e., for a given DCO 102 input x, (which is OTW), of the oscillator gain $K_{DCO}$ by observing the phase detector 704 output $\Delta \phi$ being a response to the $\Delta x$ input perturbation at the previous reference clock cycle. Naturally, $f_{ref}$ is the system 700 parameter that is, for all practical purposes, known exactly. Those skilled in the art can appreciate that since the phase detector 704 can have a nonzero resolution, a larger $\Delta x$ may be required to observe a statistically significant response in $\Delta \phi$. Most preferably, the estimate of $K_{DCO}$ is averaged over a number of measurements. The estimate of $K_{DCO}$ can be stored in a table for some period of time. Preferably, the oscillator gain $K_{DCO}$ is re-estimated periodically, especially in response to changes in PLL operating conditions such as temperature and/or voltage changes.

Figure 8A:
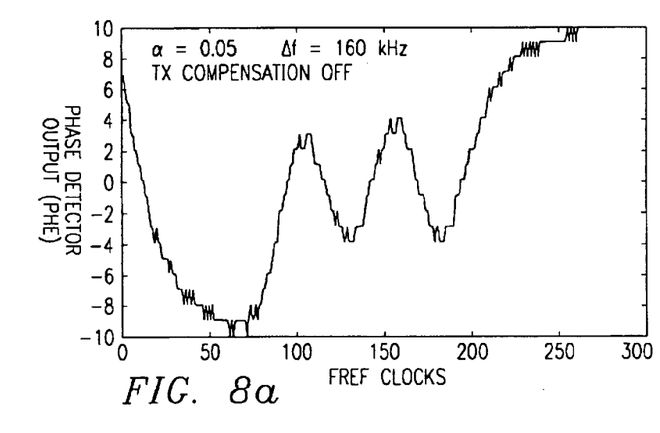
FIGS. 8(a)–8(d) show a simulated response of the closed-loop type-I all-digital phase-locked loop (ADPLL) synthesizer illustrated in FIG. 5 to the direct BT=0.5 GFSK modulation ("BLUETOOTH" specification) with the loop compensation mechanism depicted in FIG. 5 turned on and off.
Figure 8B:
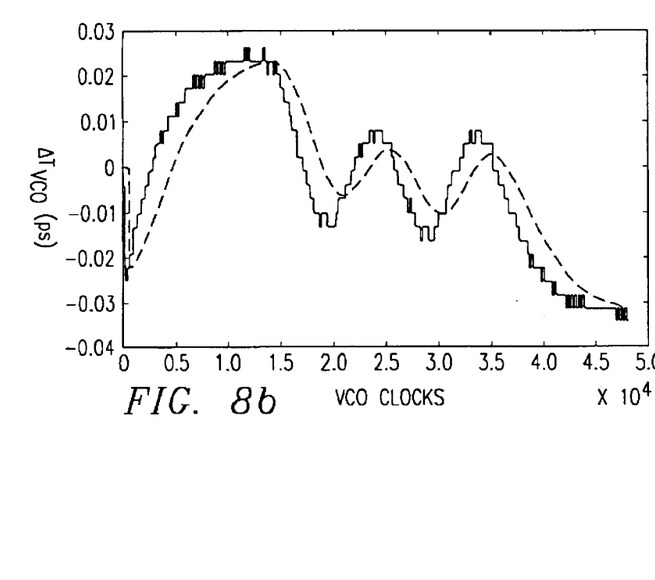
Figure 8C:
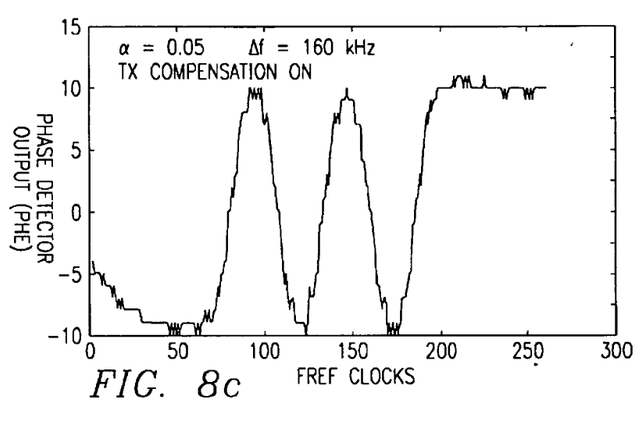
Figure 8D:
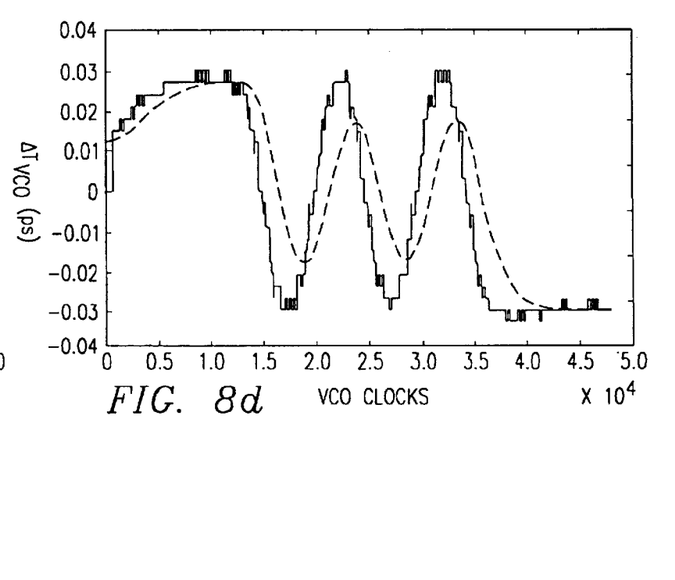

FIGS. 8(a)–8(d) show a simulated response of the closed-loop type-I al-digital phase-locked loop (ADPLL) synthesizer 500 illustrated in FIG. 5 to the direct BT=0.5 GFSK modulation ("BLUETOOTH" specification) with the loop compensation mechanism 502 depicted in FIG. 5 turned on and off. The simulated response was obtained for a normalized loop gain $\alpha$=0.05, where a critically-damped loop corresponds to $\alpha$=1.0. Throughout the simulation, the maximum frequency deviation is set at 160 kHz, which corresponds to the modulation index of 0.32. The upper FIGS. 8(a) and 8(c) depict the digital phase detector output to the nDCO 106; and the lower FIGS. 8(b) and 8(d) depict the respective instantaneous DCO 102 period deviation in ps units. The fractional phase detector resolution $\Delta f_{res}$ is 10 ps in each case (transmit modulation loop compensation scheme turned-off in FIGS. 8(a) and 8(b) and turned-on in FIGS. 8(c) and 8(d)). A 10 ps resolution can be achieved, for example, using an advanced CMOS process.

In summary explanation of the foregoing, reducing the normalized loop gain $\alpha$ to obtain adequately fine frequency resolution decreases the closed-loop PLL bandwidth such that it starts affecting the shape of the modulating 1 Mbps GFSK waveform. A closed-loop modulation method might therefore be adequate for a GSM system where the modulating frequency is on the order of tens of kHz. For "BLUETOOTH" however, and especially for lower normalized loop gain $\alpha$, it is necessary to amend the straightforward closed-loop GFSK modulation method with a PLL loop compensation scheme that will remove the loop dynamics from the modulating path. The present hybrid of predictive and closed-loop PLL operation achieves the requisite functionality by ensuring that only the modulating path operates in an open-loop fashion, while the rest of the loop, including all error sources, operate under the normal closed-loop regime.

In view of the above, it can be seen the present invention presents a significant advancement in the art of digital PLL schemes and associated methods. This invention has been described in considerable detail in order to provide those skilled in the digital PLL art with the information need to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, while certain embodiments set forth herein illustrate various hardware implementations, the present invention shall be understood to also parallel structures and methods using software implementations as set forth in the claims.

What is claimed is:

1. A digital phase-domain phase-locked loop circuit comprising:
   a digitally-controlled oscillator (DCO);
   a gain element feeding the DCO and operational to compensate for DCO gain in response to a loop gain alpha multiplier signal;

an oscillator phase accumulator operational to accumulate DCO generated clock edges;

a reference phase accumulator operational to accumulate a frequency division ratio command and a modulating data signal and to generate an accumulated frequency control word (FCW) therefrom;

a phase detector operational to compare the accumulated FCW and the accumulated DCO generated clock edges and generate a phase error in response thereto;

a loop gain alpha multiplier element operational to generate the loop gain alpha multiplier signal in response to a filtered direct modulator output signal; and a direct modulator operational in response to the modulating data signal and the filtered phase error to generate the filtered direct modulator output signal.

2. The digital phase-domain phase-locked loop circuit according to claim 1 wherein the direct modulator comprises:

a loop gain alpha inverse multiplier element operational to generate a signal in response to the modulating data signal; and a combinational element feeding the loop gain alpha multiplier element in response to the signal generated by the loop gain alpha inverse multiplier element and further in response to the phase error.

3. The digital phase-domain phase-locked loop circuit according to claim 1 further comprising a direct modulation switch element operational to selectively attenuate a feed-forward path associated with the phase-locked loop circuit.

4. The digital phase-domain phase-locked loop circuit according to claim 1 further comprising a filter operational to pass a phase error generated via the phase detector to generate the phase error.

5. The digital phase-domain phase-locked loop circuit according to claim 1 wherein the gain element is operational to generate an oscillator tuning word that is a function of a reference frequency $f_{ref}$ and an estimated DCO gain $\hat{K}_{DCO}$, wherein the function is defined by:

$$\frac{f_{ref}}{\hat{K}_{DCO}}.$$

6. A digital phase-domain phase-locked loop circuit comprising:

a digitally-controlled oscillator (DCO);

a gain element feeding the DCO and operational to compensate for DCO gain in response to a direct modulator output signal;

an oscillator phase accumulator operational to accumulate DCO generated clock edges;

a reference phase accumulator operational to accumulate a frequency division ratio command and a modulating data signal and to generate an accumulated frequency control word (FCW) therefrom;

a phase detector operation to compare the accumulated FCW and the accumulated DCO generated clock edges and generate a phase error in response thereto;

a loop gain alpha multiplier element operational to generate a loop gain alpha multiplier signal in response to the phase error; and a direct modulator operational in response to the modulating data signal and the alpha multiplier signal to generate the direct modulator output signal.

7. The digital phase-domain phase-locked loop circuit according to claim 6 wherein the direct modulator comprises:

a combinational element operational to combine the modulating data signal and the alpha multiplier signal.

8. The digital phase-domain phase-locked loop circuit according to claim 7 further comprising a direct modulation switch element operational to selectively attenuate a feed-forward path associated with the phase-locked loop circuit.

9. The digital phase-domain phase-locked loop circuit according to claim 6 further comprising a filter operational to pass said phase error generated via the phase detector to generate a filtered phase error.

10. The digital phase-domain phase-locked loop circuit according to claim 6 wherein the gain element is operational to generate an oscillator tuning word that is a function of a reference frequency $f_{ref}$ and an estimated DCO gain $\hat{K}_{DCO}$, wherein the function is defined by $$\frac{f_{ref}}{\hat{K}_{DCO}}.$$

11. A phase-locked loop system comprising:

a digitally-controlled oscillator responsive to an oscillator tuning word (OTW) to generate an oscillator clock;

a direct modulator operational in response to a modulating data signal and a phase error to generate the OTW; and a phase-locked loop (PLL) operational in response to a channel selection signal and the modulating data signal to generate the phase error, the phase-locked loop (PLL) including a loop gain multiplier operational to generate a multiplier signal in response to the phase error.

12. A phase-locked loop system comprising:

a digitally-controlled oscillator responsive to an oscillator tuning word (OTW) to generate an oscillator clock, the digitally-controlled oscillator comprising a voltage controlled oscillator and a digital-to-analog converter operational to generate an oscillator tuning voltage in response to the OTW;

a direct modulator operational in response to a modulating data signal and a phase error to generate the OTW; and a phase-locked loop (PLL) operational in response to a channel selection signal and the modulating data signal to generate the phase error, the phase-locked loop (PLL) including a loop gain multiplier operational to generate a multiplier signal in response to the phase error.

13. A phase-locked loop system comprising:

a digitally-controlled oscillator responsive to an oscillator tuning word (OTW) to generate an oscillator clock;

a direct modulator operational in response to a modulating data signal and a phase error to generate the OTW, said direct modulator comprising a combinational element feeding the digitally controlled oscillator such that an oscillator gain can be compensated to substantially remove its effects on loop behavior; and a phase-locked loop (PLL) operational in response to a channel selection signal and the modulating data signal to generate the phase error, the phase-locked loop (PLL) including a loop gain multiplier operational to generate a multiplier signal in response to the phase error.

14. A phase-locked loop system comprising:

a digitally-controlled oscillator responsive to an oscillator tuning word (OTW) to generate an oscillator clock;

a direct modulator operational in response to a modulating data signal and a phase error to generate the OTW;

a phase-locked loop (PLL) operational in response to a channel selection signal and the modulating data signal to generate the filtered phase error, the phase-locked loop (PLL) including a loop gain multiplier operational to generate a multiplier signal in response to the phase error; and a direct modulation switch element operational to selectively attenuate a feed-forward path associated with the PLL.

15. The phase-locked loop system according to claim 14 wherein a path through the direct modulator is defined by a transferer path gain between the modulation switch element and the digitally-controlled oscillator.

16. A phase-locked loop system comprising:

a digitally-controlled oscillator responsive to an oscillator timing word (OTW) to generate an oscillator clock;

a direct modulator operational in response to a modulating data signal and a filtered phase error to generate the OTW;

a phase-locked loop (PLL) operational in response to a channel selection signal and the modulating data signal to generate the filtered phase error; and a direct modulation switch element operational to selectively attenuate a feed-forward path associated with the PLL wherein a path through the direct modulator is defined by a transfer path gain between the modulation switch element and the digitally-controlled oscillator and wherein the transfer path gain is dependent upon a reference frequency $f_{ref}$ and an estimated digitally-controlled oscillator gain $\hat{K}_{DCO}$, is functionally defined as $$\frac{f_{ref}}{\hat{K}_{DCO}}.$$

17. A phase-locked loop system comprising:

a digitally-controlled oscillator responsive to an oscillator tuning word (OTW) to generate an oscillator clock;

a direct modulator operational in response to a modulating data signal and a phase error to generate the OTW; and a phase-locked loop (PLL) operational in response to a channel selection signal and the modulating data signal to generate the phase error, said PLL comprising a phase detector feeding filter, wherein the phase detector is responsive to the channel selection signal and the modulating data signal to generate said phase error, the phase-lkocked loop (PLL) including a loop gain multiplier operational to generate a multiplier signal in response to the phae error.

18. A method of operating a digital phase-locked loop (PLL) system comprising the steps of:

(a) providing a phase-locked loop including a digitally-controlled oscillator (DCO) having a gain $K_{DCO}$, and a phase detector, wherein the DCO is responsive to an oscillator tuning word (OTW) to generate a DCO output clock having a frequency $f_v$, and further wherein the phase detector is responsive to a channel selection signal, a modulating data signal and the output clock to generate a phase error;

(b) providing a direct modulator operational in response to the phase error and the modulating data signal to generate the OTW;

(c) observing an accumulated phase $\Delta\phi$ in the phase error in response to a given change $\Delta x$ in the OTW; and (d) estimating the DCO gain $\hat{K}_{DCO}$, defined by $$\hat{K}_{DCO} = \frac{\Delta\phi}{\Delta x} \cdot f_{ref}$$

such that a DCO gain can be compensated to substantially remove its effects on loop behavior.

19. The method according to claim 18 further comprising the step of:

repeating step (c) and step (d) a plurality of times to obtain an average value for the estimated DCO gain $\hat{K}_{DCO}$.

20. The method according to claim 19 further comprising the step of:

(e) re-estimating the DCO gain $\hat{K}_{DCO}$, in response to changes in PLL operting
parameters such that the DCO gain can be compensated to substantially remove its effects on loop behavior in response to the changes in PLL operating parameters.

21. The method according to claim 18 wherein the accumulated phase $\Delta\phi$ in the phase error is generated via a fractional phase error correction process.

22. The digital phase-domain phase-locked loop circuit according to claim 1 wherein said phase error is a filtered phase error.

23. The digital phase-domain phase-locked loop circuit according to claim 6 wherein said phase error is a filtered phase error.

24. The phase-locked loop system according to claim 11 wherein said phase error is a filtered phase error.

25. A method of operating a digital phase-locked loop (PLL) comprising the steps of:

providing a phase-locked loop including a digitally-controlled oscillator (DCO) having a gain $K_{DCO}$, and a phase detector wherein the DCO is responsive to an oscillator tuning word (OTW) to generate a DCO output clock having a frequency $fv$ and further wherein the phase detector is responsive to a channel selection signal, a modulating data signal and the output clock to generate a phase error;

providing a direct modulator oprational in response to the phase error and the modulating data signal to generate the OTW;

observing an accumulated phase $\Delta\emptyset$ in the phase error in response to a given change $\Delta x$ in the OTW; and estimating the DCO gain such that a DCO gain can be compensated to substantially remove its effects on loop behavior.

* * * * *